(12) United States Patent
Nagata

(10) Patent No.: US 7,667,477 B2
(45) Date of Patent: Feb. 23, 2010

(54) CIRCUIT FOR DETECTING AND MEASURING NOISE IN SEMICONDUCTOR INTEGRATED CIRCUIT

(75) Inventor: Makoto Nagata, Hyogo (JP)

(73) Assignee: The New Industry Research Organization, Hyogo (JP)

( * ) Notice: Subject to any disclaimer, the term of this patent is extended or adjusted under 35 U.S.C. 154(b) by 664 days.

(21) Appl. No.: 10/568,865

(22) PCT Filed: Aug. 20, 2004

(86) PCT No.: PCT/JP2004/011978

§ 371 (c)(1),
(2), (4) Date: Feb. 21, 2006

(87) PCT Pub. No.: WO2005/020324

PCT Pub. Date: Mar. 3, 2005

(65) Prior Publication Data

US 2006/0221531 A1 Oct. 5, 2006

(30) Foreign Application Priority Data

Aug. 22, 2003 (JP) ............................. 2003-298080

(51) Int. Cl.
*G01R 31/27* (2006.01)
*H01L 23/58* (2006.01)
*G06F 17/50* (2006.01)

(52) U.S. Cl. ................. 324/763; 257/48; 257/E21.522; 257/E21.531; 438/18; 716/4

(58) Field of Classification Search ................. 324/763; 257/48, E21.522, E21.531; 438/18; 716/4
See application file for complete search history.

(56) References Cited

U.S. PATENT DOCUMENTS

| 5,341,046 A * | 8/1994 | Crafts ........................ 327/427 |
| 5,946,482 A * | 8/1999 | Barford et al. ................ 703/14 |
| 6,789,220 B1 * | 9/2004 | Lovejoy ..................... 714/733 |
| 6,823,293 B2 * | 11/2004 | Chen et al. .................. 702/191 |
| 7,339,411 B2 * | 3/2008 | Yuuki et al. ................. 327/198 |

* cited by examiner

*Primary Examiner*—Evan Pert
(74) *Attorney, Agent, or Firm*—Posz Law Group, PLC

(57) ABSTRACT

Noise measuring circuitry of the present invention can be used to observe power supply noise waveforms, ground level noise waveforms, and a spatial distribution of noise at different positions in an integrated circuit having plural circuit blocks that perform digital signal processing, by being integrated into the integrated circuit (i.e., embedded), distributed at different positions. The distributed noise measuring circuitry can be manufactured using a CMOS process to manufacture the integrated circuit. The power supply noise measuring circuit and the ground level noise measuring circuit comprise a source follower, a select read out switch, and source-grounded amplifier. These noise measuring circuits can be configured by several (about 6) MOS transistors, so the layout for the measuring circuit can be small and can be achieved by using a logic gate circuit of the same size as that of a standard cell type logic gate circuit. As for the output of the noise measuring circuits, the output current of said source-grounded amplifier is connected to the current bus line, the outputted current is amplified and the amplified current is read by driving the external resistance load circuit. Plural noise measuring circuits can be connected parallel to the current bus line. Measuring multiple noise points in the main integrated circuit can be achieved by reading out the output current.

20 Claims, 9 Drawing Sheets

CIRCUIT FOR DETECTING AND MEASURING NOISE IN SEMICONDUCTOR INTEGRATED CIRCUIT

TECHNICAL FIELD

The present invention relates to a noise measuring circuit for detecting and measuring noise included in the power supply signal or the ground level signal of a large-scale integrated circuit device.

BACKGROUND ART

Due to the progression of the large-scale design in the semiconductor device accompanying the micro-fabrication technology development in the semiconductor manufacturing process, voltage fluctuation may occur in the power supply signal or the ground level signal when the integrated circuit device is activated. The voltage fluctuation deteriorates the reliability of the integrated circuit operation. With a view to solve the above-mentioned problem, in order to analyze the malfunction which causes the error in the integrated circuit, an evaluation method for evaluating the voltage fluctuation in the power supply signal or in the ground level signal is strongly required, in short, a noise evaluation method is strongly required.

Conventionally, the use of the noise evaluation method is mainly limited to the research purpose. Many researches are focused on developing the dedicated purpose test chips wherein both the main large-scale integrated circuit (which turns to be the noise source) and the noise measuring circuit are embedded. However, the conventional noise measuring circuit is arranged in the chip separated from the main large-scale integrated circuit (which turns to be the noise source), as seen in FIG. 11. Therefore, it is difficult to use the conventional noise measuring circuit as a practical-use malfunction analysis circuit in the commercial base large-scale integrated circuit chip because of problems such as the necessity of leading the probe to the target position for the noise detection, the largeness of the layout area, and the largeness of the power consumption.

Under the above-mentioned circumstances, the chip configuration wherein the noise measuring circuit is combined with the main large-scale integrated circuit is known in the conventional technology for detecting the malfunction in the main large-scale integrated circuit accompanying increasing of the noise level in the power supply signal (for example, the prior art document 1). However, the noise measuring circuit described in the prior art document 1 detects the voltage level of the power supply line, compares the detected voltage level with the predetermined threshold voltage level set previously in the circuit, and performs the predetermined procedure when the detected noise level is larger than the predetermined threshold voltage level, so the conventional prevention method is only focused on the instantaneous values of the noise data. Therefore, the temporal transitional series data of the voltage level fluctuation and the noise level fluctuation cannot be obtained. In the conventional technology, it is difficult to perform the malfunction diagnosis or the error analysis for judging whether or not an error is occurred by the noise, and whether or not the timing when the error had occurred corresponds to the timing when the noise had occurred.

[Prior Art Document 1]: Japanese Patent publication No. 2002-222929.

DISCLOSURE OF THE INVENTION

The Problem to be Solved

In the conventional configuration of the semiconductor integrated circuit device as shown in FIG. 11, the noise measuring circuit is arranged in the external position separated from the main large-scale integrated circuit (the noise to be measured), so there are problems such as the necessity of leading the probe to the target place for noise detection, and the disadvantage of the deterioration of the detection characteristic due to the existence of the parasitic capacitance and the parasitic resistance in the leading wire accompanying the increase of the leading wire length in proportion to the expansion of the layout area.

In order to shorten the leading wire length, the circuit layout modification, which may be a troublesome task, should be required. Therefore, with the foregoing in mind, it is the first object of the present invention to provide a noise measuring circuit having a small configuration in order to combine them to the main large-scale integrated circuit.

There is another problem that it is difficult for the conventional noise measuring circuit to figure out the temporal transitional noise in the power supply and the ground because the noise is detected as the instantaneous values. It is the second object of the present invention to provide a noise measuring circuit in order to figure out the noise waveforms as the analog waveforms in the time dimension not as the instantaneous values, and to obtain the temporal transition of the noise in the voltage level fluctuation by outputting noise waveforms as the series data of the voltage level signal and the ground level signal or as the sampled analog values.

Next, a large-scale digital integrated circuit is configured by the tens of millions of transistors, the layout area is beyond several millimeter-square, therefore, it is strongly required to figure out the spatial intensity distribution of the voltage level and the ground level as an important step to analyze the malfunction of the main large-scale integrated circuit. It is the third object of the present invention to provide a noise measuring circuit in order to figure out the noise spatial intensity distribution by measuring noise at multiple points by combining several noise measuring circuits into the main large-scale integrated circuit.

Next, an accuracy evaluation based on the actual measurement of the noise in the voltage level and the ground level is indispensable when applying a simulation software for analyzing and predicting the noise in the voltage level and the ground level to the practical system design. It is the fourth object of the present invention to provide a noise measuring circuit in order to improve the accuracy of the simulation software by performing the noise distribution measurement and using the measured noise data.

Means for Solving the Problem

The semiconductor integrated circuit has a layout wherein the height of the cells is a constant value and the power supply line and the ground line are arranged in a constant position, and the basic logic gate cells are arrayed (the standard cell type circuit configuration). As shown in FIG. 12, the noise measuring circuit for the power supply line and the ground level line has a configuration wherein the height of the cells of the noise measuring circuit is the same as that of the digital circuit, and the power supply line and the ground line in the digital circuit to be detected across the same position as that of the standard cell type circuit.

The noise measuring circuit of the integrated circuit of the present invention is formed by the CMOS semiconductor integrated circuit device manufacturing process. The noise measuring circuit corresponding to the power supply line (a high voltage side) comprises a drain-grounded amplifier (a source follower) configured by a n-type MOSFET or a p-type MOSFET, selective read switch, and a source-grounded amplifier configured by a p-type MOSFET. The noise measuring circuit corresponding to the ground (low voltage side) line comprises a drain-grounded amplifier (a source follower) configured by a p-type MOSFET, selective read switch, and a source-grounded amplifier configured by a n-type MOSFET. These noise measuring circuits can be configured by several (about 6) MOS transistors, so the layout for the noise measuring circuit can be small and be achieved by the same size as that of a standard cell type logic gate circuit.

As for the output of the noise measuring circuits, the output current of the source-grounded amplifier is led to the current bus line, the outputted current is amplified by a current mirror circuit, and the amplified current is read by the external resistance load circuit. Plural noise measuring circuits can be connected parallel to the current bus line, the noise measuring circuit can be selectively activated by a select signal, and the noise measuring at the multiple points in the main integrated circuit can be achieved by reading out the output current.

THE EFFECT OF THE INVENTION

The noise measuring circuit of the present invention can be configured in small size and be embedded into the main large-scale integrated circuit, therefore, the noise measuring circuit of the present invention can detect and measure noise at any desirable points in the main large-scale integrated circuit by embedding the noise measuring circuit at the desirable points in advance. Next, there is no need for leading the probe to the desirable points, there is no deterioration of the detect characteristics, and the noise measuring circuit of the present invention can evaluate the noise in the power supply signal and the ground level easily.

The noise measuring circuit of the present invention can figure out the temporal transitional series data of the voltage fluctuation of the power supply signal and the ground level signal by measuring the noise waveform as the analog waveform in the time-dimension, not as the instantaneous values, and outputting the obtained data of the power supply and the ground level as the series analog values or as the sampled analog values.

Next, the noise spatial intensity distribution can be figured out by embedding plural noise measuring circuits into the desirable points in the large-scale integrated circuit and measuring the noise at the multiple desirable points. The malfunction diagnosis and the error analysis can be performed easily by considering the correlation among the obtained temporal transitional series data of the noise voltage level, the spatial intensity distribution of the noise voltage level, the detected points where the error had actually occurred, and the detected time when the error had actually occurred.

Next, the noise measuring circuit of the present invention can be arrayed in parallel to other standard cells at the desirable points for the noise detection in the standard cell type digital large-scale integrated circuit, so the noise measuring circuit corresponds to the automatic layout designing by the standard cell base automatic place-and-route design software, so the noise measuring circuit of the present invention can be embedded into the large-scale integrated circuit as a malfunction analysis diagnosis circuit for the practical use in advance.

Moreover, recently, the large-scale integrated circuit often requires reducing the noise level of the digital substrate in the analog-digital mixture LSI and for controlling the threshold voltage of the MOSFET for the digital large-scale integrated circuit. For that purpose, the large-scale integrated circuit comprises the power supply line (VDD) and the ground line (VSS) are divided from the line for fixing the voltage level of the well where the MOSFET of the main large-scale integrated circuit is arranged. The noise measuring circuit of the present invention can be used for detecting noise at every line related to the power supply line and the ground line in the large-scale integrated circuit such as VDD, VSS, N-well fixed power line (VDD_N-well) in the P-type MOSFET, and P-well fixed ground line (VSS_P-well) in the N-type MOSFET.

DESCRIPTION OF THE PREFERRED EMBODIMENTS

Hereinafter, the description of the preferred embodiments is described with referring Figures.

First Embodiment

FIG. 1 shows the circuit diagram of the power supply noise measuring circuit of the present invention. The power supply noise measuring circuit of the present invention, adapted to a semiconductor integrated circuit including plural circuit blocks for conducting signal processing, comprises a n-type source follower 1a connected the input node to the power supply line to be measured, a signal conversion amplifier circuit 2 converting voltage-input to current-output which input is the output of the source follower 1a, and a current readout circuit 3 for reading out the output current of the signal conversion amplifier circuit 2. In addition, FIG. 1 shows other circuit elements of the power supply noise measuring circuit, an inverter circuit 4 having a function for activating the power supply noise measuring circuit selectively, and a cut-off switch 5 for switching the current readout circuit 2.

Hereinafter, the operation of the power supply noise measuring circuit of the first embodiment of the present invention will be described by referring FIG. 1. First, the mechanism of noise occurrence will be described briefly. The operation of the CMOS logic circuit is to generate a logical signal by switching on and off the elements such as transistors in the circuit by the input signals. At this moment, transient current will be inputted from the power supply due to charge or discharge parasite capacitance in the circuit and be outputted to the ground. The noise will be generated by the transient current going through the resistance or the impedance elements of the power supply lines.

In order to detect the noise in the power supply lines, the input side terminal of the n-type source follower 1a (VIN) shown in FIG. 1 is connected to the power supply line (VDD) of the main integrated circuit. The power supply for the noise measuring circuit (AVDD) and the ground for the noise measuring circuit (AGND) are installed independent from the line lead to the power supply (VDD) and the ground (VSS), so the noise can be measured precisely.

The inverter circuit 4 shown in FIG. 1, a n-channel MOSFET and a p-channel MOSFET are connected serially, when signal "1" is inputted to the select switch (SEL), so the input signal to the input terminal of the inverter circuit 4 will be "0" and the n-channel MOSFET turns off, on the contrary, p-channel MOSFET turns on, the bias voltage (VBS) is inputted to the input gate of the source follower, the source follower turns to be active status.

When signal "1" is inputted to the select switch (SEL), the cut-off switch 5 for switching the current readout circuit turns off, both the following signal conversion amplifier circuit 2 converting voltage-input to current-output and the current readout circuit 3 turn on. Therefore, the output voltage of the source follower becomes the input signal of the signal conversion amplifier circuit 2 converting voltage-input to current-output. The voltage fluctuation which will be the power supply noise is amplified and outputted as the current fluctuation, so the noise information can be extracted as the analog values from the output of the current readout circuit 3. By this method, the temporal transition of the power supply noise can be obtained. The above-mentioned power supply noise measuring circuit uses the n-type source follower, in the recent integrated circuit, plural transistors having different operating voltage can be installed in the same circuit, a p-channel source follower can be used by selecting the VDD and the AVDD appropriately (AVDD is set a few voltage higher than VDD).

FIG. 2 shows the circuit diagram of the ground noise measuring circuit of the present invention. The ground noise measuring circuit of the present invention, adapted to a semiconductor integrated circuit including plural circuit blocks for conducting signal processing, comprises a p-type source follower 1b connected the input node to the ground line to be measured, a signal conversion amplifier circuit 2 converting voltage-input to current-output which input is the output of the source follower 1b, and a current readout circuit 3 for reading out the output current of the signal conversion amplifier circuit 2. In addition, the same as FIG. 1, FIG. 2 shows other circuit element of the ground noise measuring circuit, an inverter circuit 4 having a function for activating said ground noise measuring circuit selectively, and a cut-off switch 5 for switching said current readout circuit.

As for the operation of the ground noise measuring circuit, basic operation is the same as that of FIG. 1 except for some features as follows; the input side of the p-type source follower 1b (VIN) shown in FIG. 2 is connected to the ground line (VSS) of the integrated circuit to be measured, the polarity of the MOSFET becomes invert contrary to that of FIG. 1, and the operation of the select signal becomes invert contrary to that of FIG. 1.

Next, the power supply noise measuring circuit (with the sampling switch) of the present invention shown in FIG. 3 is described. In case of the power supply noise measuring circuit shown in FIG. 1, the voltage fluctuation of the power supply line of the integrated circuit is obtained continuously, however, in case of the power supply noise measuring circuit shown in FIG. 3, the operation is the same as the power supply noise measuring circuit shown in FIG. 1 when the sampling switch (SW) status is "1" but the power supply noise measuring circuit holds the instantaneous value of the noise when the sampling switch (SW) status turns from "1" to "0". Therefore, it is possible to obtain the noise waveform using the sampling method by synchronizing the sampling switch (SW) operation and the digital circuit operation, and measuring the noise by shifting minute time step by step.

The effect of the obtaining noise waveform by sampling method is described as follows. The measurement operation of the continuous-time type power supply measuring circuit as shown in FIG. 1, noise is superimposed on the output waveform of the noise measuring circuit, so the detected noise waveform in the read-out waveform can be different from the noise waveform. By applying the sampling method, each instantaneous value of the noise waveform is read-out as the DC voltage element, the superimposed noise can be eliminated.

Next, the operation of the ground noise measuring circuit (with the sampling switch) shown in FIG. 4 is the same as the ground noise measuring circuit shown in FIG. 3. In case of the ground noise measuring circuit shown in FIG. 2, the voltage fluctuation on the ground line for the integrated circuit is obtained continuously, in case of the ground noise measuring circuit shown in FIG. 4, the ground noise measuring circuit holds the instantaneous value of the noise when the sampling switch (SW) status turns from "1" to "0".

The power supply noise measuring circuit shown in FIG. 3 and the ground noise measuring circuit shown in FIG. 4 have following merits by using the sampling switch circuit. The merit for using the sampling switch circuit is that the polarity of the MOSFET in the current read-out circuit 3 can be designed same in the circuit configuration between the power supply noise measuring circuit and the ground noise measuring circuit. It is necessary for achieving the above-mentioned merit that the input DC voltage of the signal conversion amplifier circuit 2 should be almost same. In order to equalize the input DC voltage, it is important to adjust the voltage difference between the power supply for the main integrated circuit (VDD) and the power supply for the noise measuring circuit (AVDD) and to adjust the transistor size of the source follower (1a, 1b). By these adjustments, when the input DC voltage of the signal conversion amplifier circuit 2 can be almost equalized, the design of the current read-out circuit 3 can be used commonly.

FIG. 5 shows the power supply noise measuring circuit diagram. In the large-scale digital integrated circuit, the layout area for it exceeds several millimeter squares, so the noise spatial intensity distribution should be figured out for the malfunction analysis as mentioned before. In order to figure out the noise spatial intensity distribution, plural small power supply noise measuring circuits are embedded and arranged to the desirable portion in the main integrated circuit. In this embodiment, the circuit configuration of the power supply noise measuring circuit is shown as FIG. 5, the current output terminal (IOUT) is installed to the signal conversion amplifier circuit, and the current read-out circuit 3 is shared among plural noise measuring front end part. Plural n-type noise measuring front-end parts 7a for power supply noise measuring are installed in the integrated circuit and those plural n-type noise measuring front end parts 7a perform multiple points measurement. In this configuration, the current read-out circuit 3 shared among plural noise measuring front end part can read only the signal from the selected noise measuring front end part by turning on the cut-off switch of the current read-out circuit of all non-selected noise measuring front end part except for the selected noise measuring front end part. Plural noise measuring front-end part 7a can be configured by several (about 6) MOSFET transistors, so the layout for the noise measuring circuit can be small and the noise measuring circuit can be embedded to the integrated circuit easily.

FIG. 6 shows the ground noise measuring circuit diagram. The same as FIG. 5, the circuit configuration of the ground noise measuring circuit is shown in FIG. 6, the current output terminal (IOUT) is installed to the signal conversion amplifier circuit, and the current read-out circuit 3 is shared among plural noise measuring front-end part. Plural p-type noise measuring front-end parts 7b for ground noise measuring are installed in the integrated circuit for performing the multiple points noise measurement. Plural noise measuring front-end part 7b can be configured by several (about 6) MOSFET transistors, so the layout for the noise measuring circuit can be small and the noise measuring circuit can be embedded to the integrated circuit easily.

In case of performing the multiple points noise measurement by the power supply measuring circuit and the ground noise measuring circuit (with the sampling switch) as shown in FIG. 7 and FIG. 8, the compact design can be achieved by dividing the noise measuring front end part (8a, 8b) and the current read-out circuit 3 in the circuit configuration, and sharing the current read-out circuit 3 among plural noise measuring front end part (8a, 8b), therefore, the compact layout for the power supply measuring circuit and the ground noise measuring circuit can be achieved in the same size as that of a standard cell type logic gate circuit. As mentioned before, by using the sampling switch circuit, the polarity of the MOSFET in the current read-out circuit 3 can be designed same between the power supply noise measuring circuit configuration and the ground noise measuring circuit configuration, therefore the current read-out circuit 3 can be shared among the main integrated circuit in case that plural small power supply noise measuring circuit and the ground noise measuring circuit are embedded and arranged to the desirable portion in the main integrated circuit.

The whole configuration of the multiple points noise measuring circuit is shown in FIG. 9. The noise measuring circuit comprises the current read-out circuit 3, the select signal generating digital circuit 10 and the noise measuring frond end part 11. The current read-out circuit 3 is shared among plural noise measuring front end part as mentioned before. In case that the input terminal voltage to be measured (VIN) is connected to the power supply line (VDD), the plural embedded noise measuring front end part becomes the power supply noise measuring circuit. On the other hand, in case that the input terminal voltage to be measured (VIN) is connected to the ground line (VSS), the plural embedded noise measuring front end part becomes the ground noise measuring circuit. The power supply for the noise measuring circuit (AVDD), the ground for the noise measuring circuit (AGND) and the bias voltage (VBS) are connected to the common line shared among the noise measuring circuits. Also, the current output of the signal conversion amplifier circuit (IOUT) is connected to the common current bus shared among the noise measuring circuits.

As shown in FIG. 9, the number of the external pin of the noise measuring circuit of the present invention is equal to or less than 4 (AVDD, AGND, VBS, IREAD). The reason why the number of pin is equal to or less than 4, in case of using the VSS for the main integrated circuit as the AGND, the required number of the external pin is 3. However, in order to measure the power supply noise and the ground level noise of the main integrated circuit, it is preferable that the power supply and the ground for the main integrated circuit should be separated from the power supply and the ground for the noise measuring circuit. The number of the pin is important as the evaluation parameter for cost of the semiconductor integrated circuit device. The fact that the noise measuring function of the present invention can be installed by adding 4 pins shows that there is no problem for practical use.

Also, as shown in FIG. 9, by embedding the select signal generating digital part 10 independently, the operation timing of the inverter circuit for the select signal and the operation timing of the sampling switch circuit can be controlled by the digital logic circuit. The proprietary pin (the external pin) SW and SEL can be omitted by embedding the logic circuit for controlling the noise measuring portion and the noise measuring timing into the select signal generating digital control circuit part 10, and by performing the control signal generating operation in the control of the digital part test mode operation in the main integrated circuit. In addition, the noise spatial intensity distribution and the time shift can be figured out easily by controlling the circuit elements as the digital logic circuits. In other words, the built-in self test can be performed by generating the operation logic of the select timing and the sampling timing synchronizing to the test pattern built in the digital integrated circuit in advance, and by generating the select signal according to the operation logic, and by correlating the select logic of the noise measuring circuit to the test pattern logic of the main integrated circuit operated in the test mode.

The illustrative diagram of the digital integrated circuit embedded in to the multiple points noise measuring circuit is shown in FIG. 10. In the large-scale integrated circuit, as shown in FIG. 10, Most of the layout of the digital integrated circuit 14, the height of the cell is constant and the power supply line and the ground line is arranged in constant position. The power supply line for the main integrated circuit (VDD) and the ground line for the main integrated circuit (VSS) are arranged alternately, therefore, as shown in FIG. 10, the power supply line for the noise measuring circuit (the n-type noise measuring circuit) and the ground line for the noise measuring circuit (the p-type noise measuring circuit) are arranged alternately.

Next, in the digital integrated circuit wherein the multiple points noise measuring circuits are embedded, one input terminal/some input terminals of the noise measuring circuit is/are lead to outside and the known signal is inputted to the terminal/terminals and detected, the amplitude values of the measured noise waveform can be adjusted by evaluating the characteristics (the sensitivity, the amplifying ratio and so on) of the noise measuring circuit embedded in the main integrated circuit.

The analysis model evaluation such as the power supply current analysis model for CAD tool for designing the semiconductor integrated circuits can be performed by using the actually measured noise data of the measured circuit portion wherein the noise measuring circuits of the present invention are embedded. For example, some analysis models included in the simulation software are evaluated by using the actually measured noise data, so the optimum model to be used in next and subsequent integrated circuit design can be chosen appropriately.

In addition, the impedance of the power supply lines and the ground lines has frequency-dependent characteristics, the noise analysis should be performed by considering the appropriate value corresponding to the clock frequency. Therefore, the parameter adjustment such as the impedance coefficient adjustment is performed based on the noise waveforms obtained from the noise measuring circuit of the present invention, so the simulation precision will be improved.

The malfunction diagnosis, the error analysis, the malfunction prediction, and error prediction can be performed by using the actually measured noise data of the main integrated circuit portions to be measured wherein the noise measuring circuits of the present invention are embedded. The noise spatial intensity distribution and the noise temporal transitional data can be figured out based on the analog values of the read-out current (IREAD) which are output data of the current read-out circuit of the noise measuring circuit, therefore, the malfunction analysis and the error analysis can be performed based on the evaluation on the relationship among the actual noise and the noise spatial intensity distribution and the noise temporal transitional data by specifying the position and the timing of the malfunction and error. In addition, it is expected that the malfunction prediction and error prediction for new developing products will be possible based on the database storing the analysis data and the actually measured data of the noise in the power supply and the ground level classified by the circuit design type.

For arranging the noise measuring circuit of the present invention, the noise measuring circuit can be automatically embedded into the main integrated circuit portion to be measured by applying the standard cell base automatic layout design method at the same time when the digital main integrated circuit is designed. As shown in FIG. 12, the noise measuring circuit of the present invention can be arrayed in parallel to other standard cells at the desirable points for noise detection in the standard cell type digital large-scale integrated circuit, so the noise measuring circuit corresponds to the automatic layout design by the standard cell base automatic wire layout designing software. Because of the automatic layout, the design cost can be reduced and the noise measuring circuit of the present invention can be embedded into the large-scale integrated circuit as a malfunction analysis diagnosis circuit for the practical use in advance, and the convenience will be enhanced. As for the arrangement position of the noise measuring circuit, optimum arrangement can be achieved based on the logic activation rate distribution data.

The aspect of the embedded distribution arrangement of the power supply noise measuring circuit and the ground level noise measuring circuit in the main integrated circuit is shown in FIG. 13. By the embedded distribution arrangement of the power supply noise measuring circuit and the ground level noise measuring circuit into the main integrated circuit, the power supply noise waveform and the ground level noise waveform and the spatial distribution data can be obtained, these data are generated when the main integrated circuit is operated. The magnified figure of the example chip of the semiconductor integrated circuit wherein the noise measuring circuits are embedded practically is shown in FIG. 14.

For the purpose of reducing the noise level of the digital substrate in the analog-digital mixture LSI and controlling the threshold voltage of the MOSFET for the digital large-scale integrated circuit, the noise measuring circuits (P1, P2, N1, N2) detect the noise in the N-well fixed power supply line of the P-type MOSFET and the P-well fixed ground line of the N-type MOSFET by embedding these noise measuring circuits (P1, P2, N1, N2) into the large-scale integrated circuit wherein the power supply line and the ground line are divided from the line for fixing the voltage level of the well where the MOSFET for the main large-scale integrated circuit is installed.

FIG. 15 shows an example of the actually measured noise waveform measured by the power supply noise measuring circuit and the ground level noise measuring circuit of the present invention. This example is the measured voltage fluctuation waveform of the arbitrary position in a constant period of the main integrated circuit by the noise measuring circuit without the sampling switch. The actually measured noise waveform in the FIG. 15 indicates that the voltage of the power supply line and the ground line of the main integrated circuit are not static but dynamically fluctuating under the noise affect.

FIG. 16 shows the waveform (the power supply side) actually measured by the power supply noise measuring circuit of the present invention in case of augmenting the number of the resister circuits being operated synchronous to the noise measuring circuit. The number of the logic circuits of the main integrated circuits shown in the FIG. 16 are 8, 4, 2, 1 in order of height of the peak in the noise waveform diagram. FIG. 16 shows that the larger the number of the logic circuit is, the larger the peak of the waveform is.

FIG. 17 shows the chart of the spatial distribution of the power supply noise and the ground level noise in the semiconductor integrated circuit chip wherein the noise measuring circuits (P1, P2, N1, N2) shown in FIG. 14 are embedded. The horizontal axis of the FIG. 17 represents the position of the noise measuring circuit in the cell order, and P1, P2, N1, N2 denote the peripheral portion (N1, P2) and the center portion (P1, N2) of the main integrated circuit. The vertical axis of the FIG. 17 represents the voltage range of the ground level (0.0 v) to the power supply voltage (1.8 v). In FIG. 17, when operating the 32-bit linear feed-back shift register positioned in the seventh cell, the noise measuring circuit in the center portion of the seventh cell detects the largest voltage fluctuation. According to FIG. 17, it is possible to figure out the spatial distribution of the power supply noise and the ground level noise by using the present invention.

AVAILABILITY IN THE INDUSTRY

The noise measuring circuit and the noise measuring circuit of the present invention, different from the conventional ones, are not a proprietary test chip configuration and the area of the noise measuring circuit is small and the number of pins of the noise measuring circuit is also small, therefore the noise measuring circuit can be used for an embedded type circuit applied as a malfunction analysis diagnosis circuit for the main integrated circuit.

Figure 1:
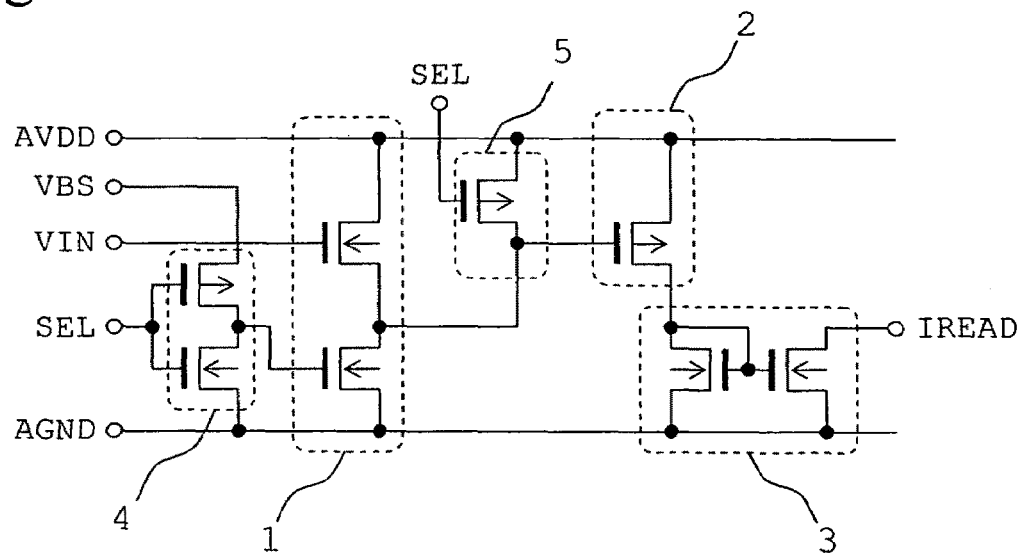
FIG. 1 a circuit diagram of the power supply noise measuring circuit
Figure 2:
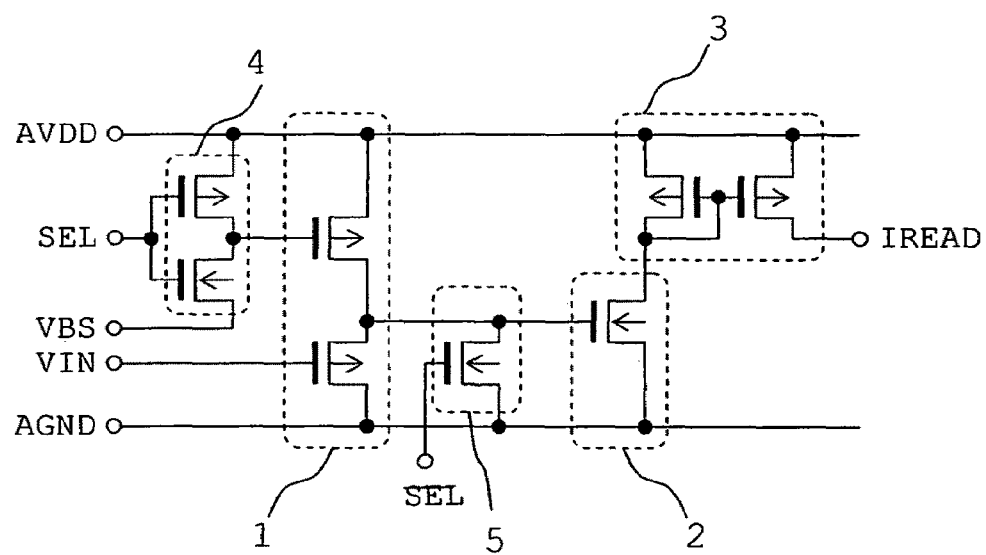
FIG. 2 a circuit diagram of the ground level noise measuring circuit
Figure 3:
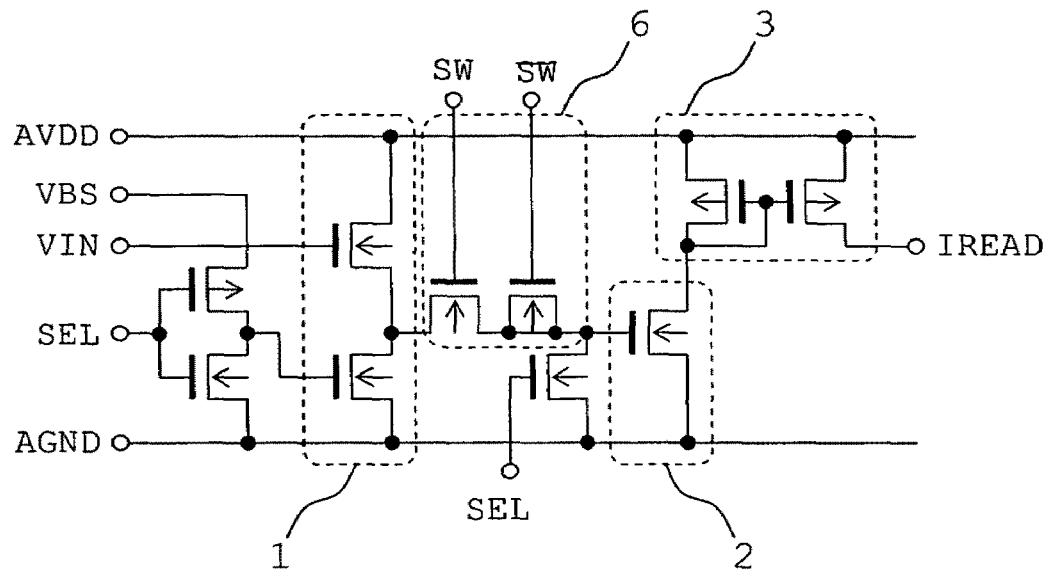
FIG. 3 a circuit diagram of the power supply noise measuring circuit (with the sampling switch)
Figure 4:
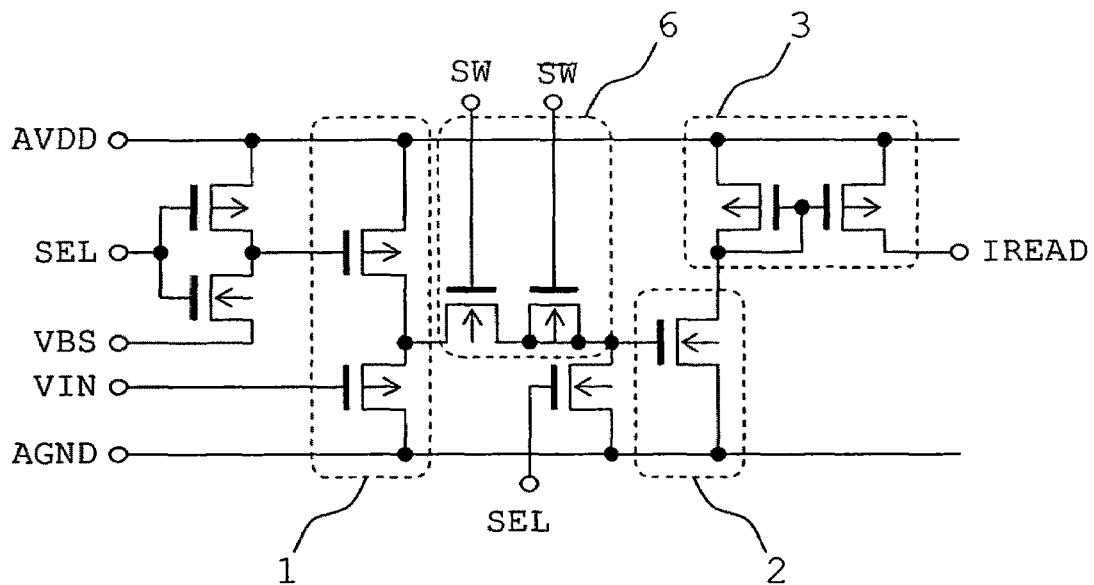
FIG. 4 a circuit diagram of the ground level noise measuring circuit (with the sampling switch)
Figure 5:
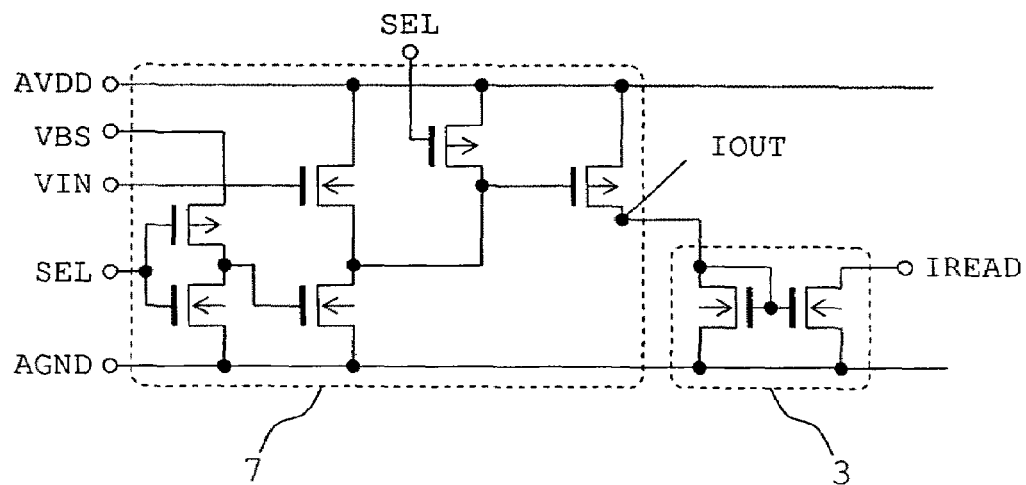
FIG. 5 a circuit diagram of the power supply noise measuring circuit
Figure 6:
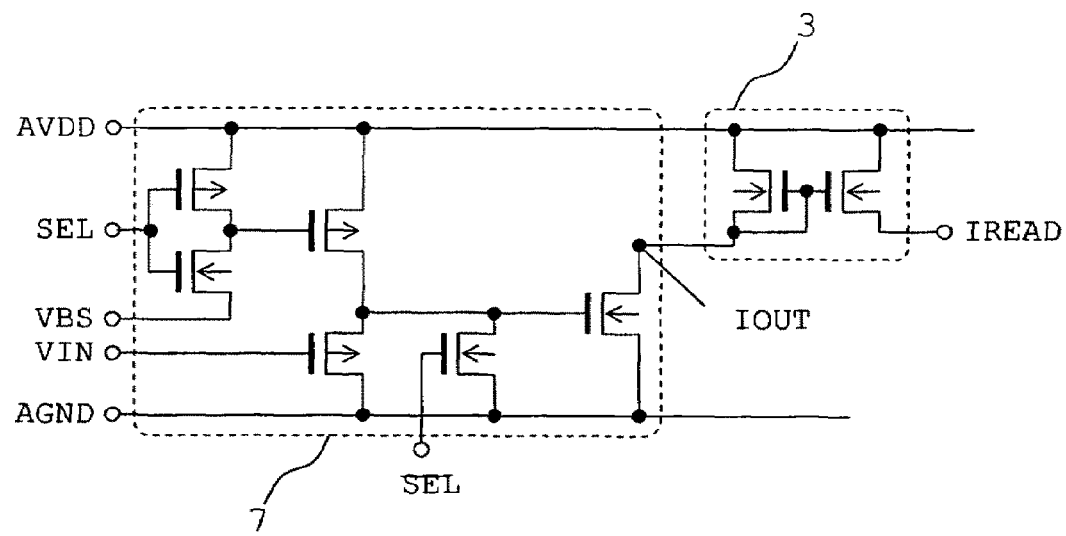
FIG. 6 a circuit diagram of the ground level noise measuring circuit
Figure 7:
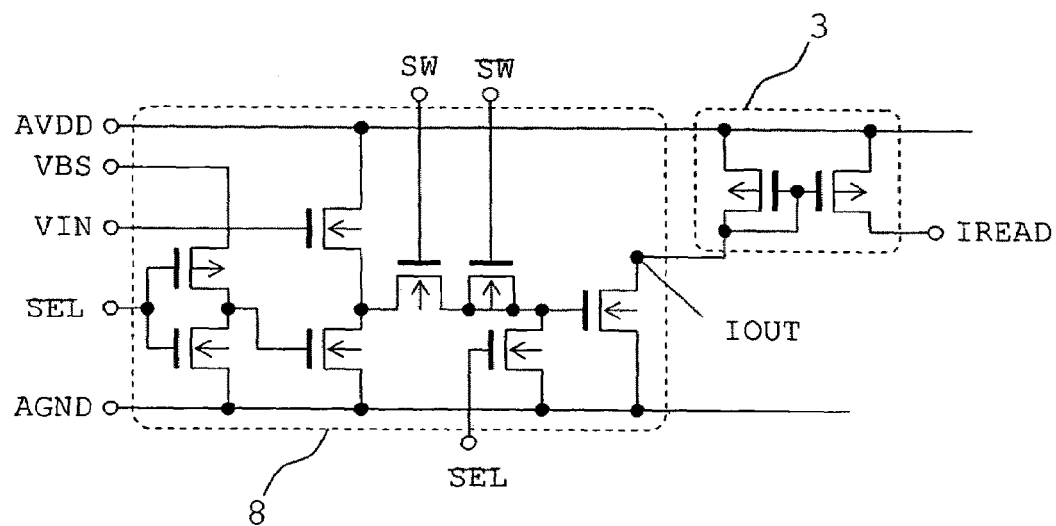
FIG. 7 a circuit diagram of the power supply noise measuring circuit (with the sampling switch)
Figure 8:
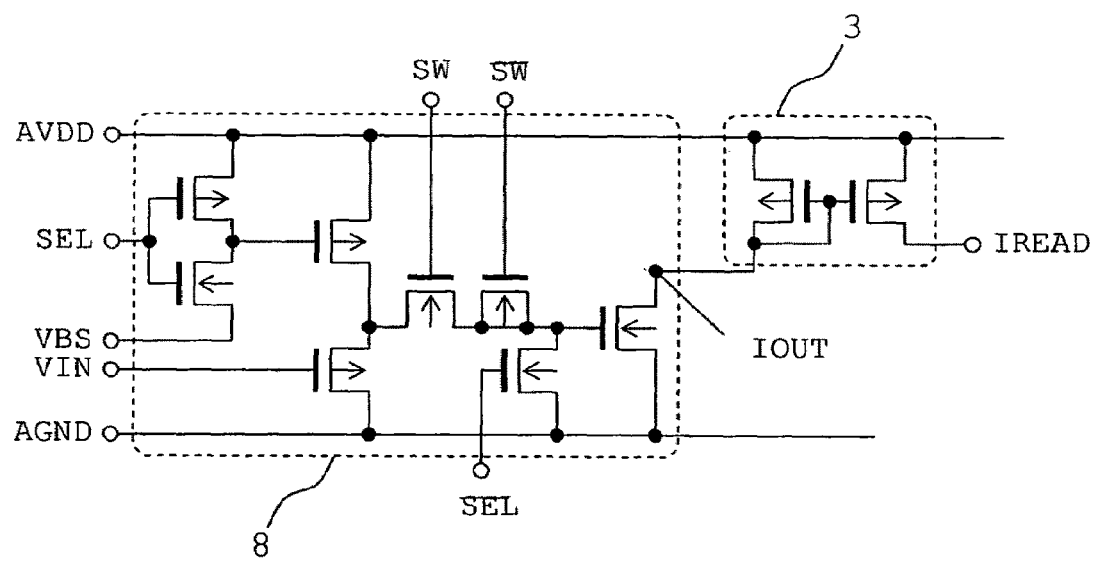
FIG. 8 a circuit diagram of the ground level noise measuring circuit (with the sampling switch)
Figure 9:
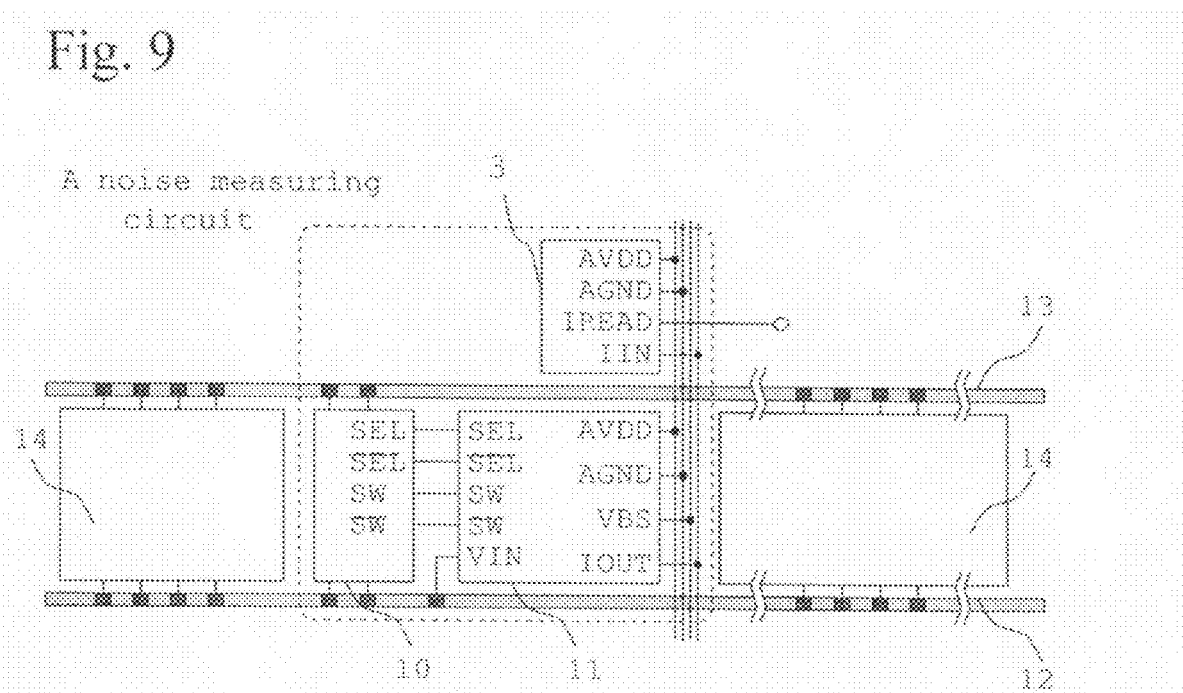
FIG. 9 a whole configuration of the multiple points noise measuring circuit
Figure 10:
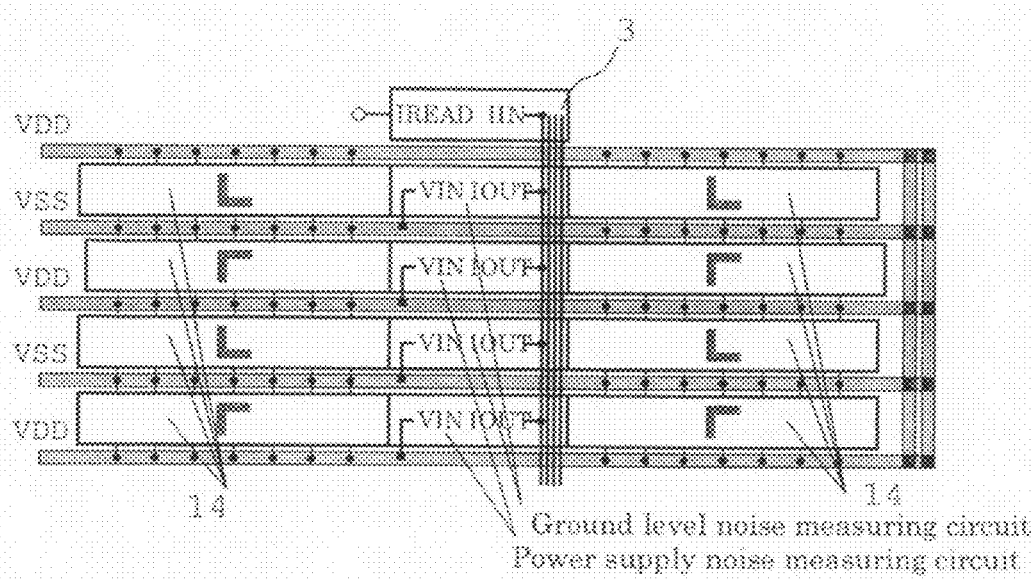
FIG. 10 an illustrative diagram of a digital integrated circuit embedded in to a multiple noise measuring circuit
Figure 11:
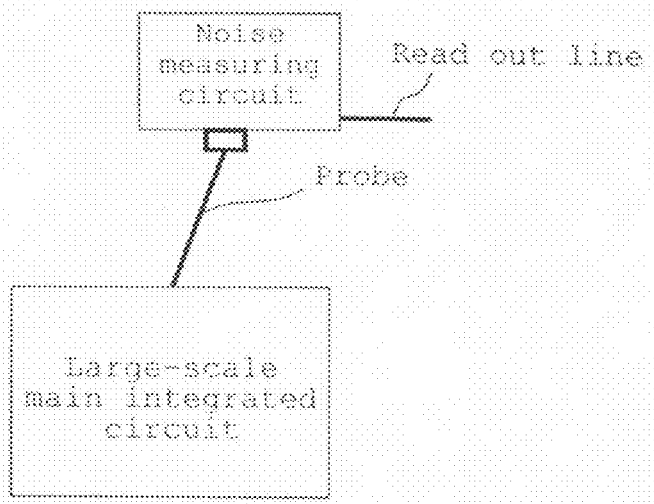
FIG. 11 is an illustrative diagram showing a conventional noise measuring circuit FIG. 12 a circuit diagram of a digital large-scale integrated circuit wherein the power supply noise measuring circuit and the ground level noise measuring circuit are embedded FIG. 13 a diagram showing an aspect of an embedded distribution arrangement of the power supply noise measuring circuit and the ground level noise measuring circuit into the main integrated circuit FIG. 14 a magnified figure of an example chip of the semiconductor integrated circuit wherein the noise measuring circuits are embedded FIG. 15 an example of the actually measured noise waveforms measured by the power supply noise measuring circuit and the ground level noise measuring circuit of the present invention FIG. 16 a waveforms actually measured by the power supply noise measuring circuit of the present invention (in case of augmenting the number of the resister circuits operating synchronous to the noise measuring circuit)
Figure 12:
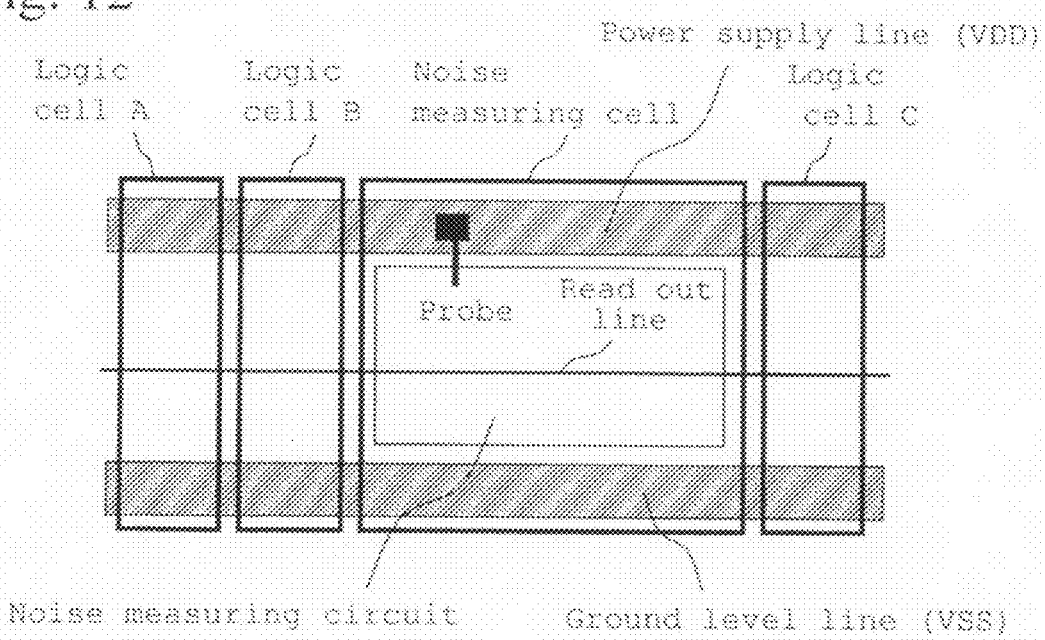
Figure 13:
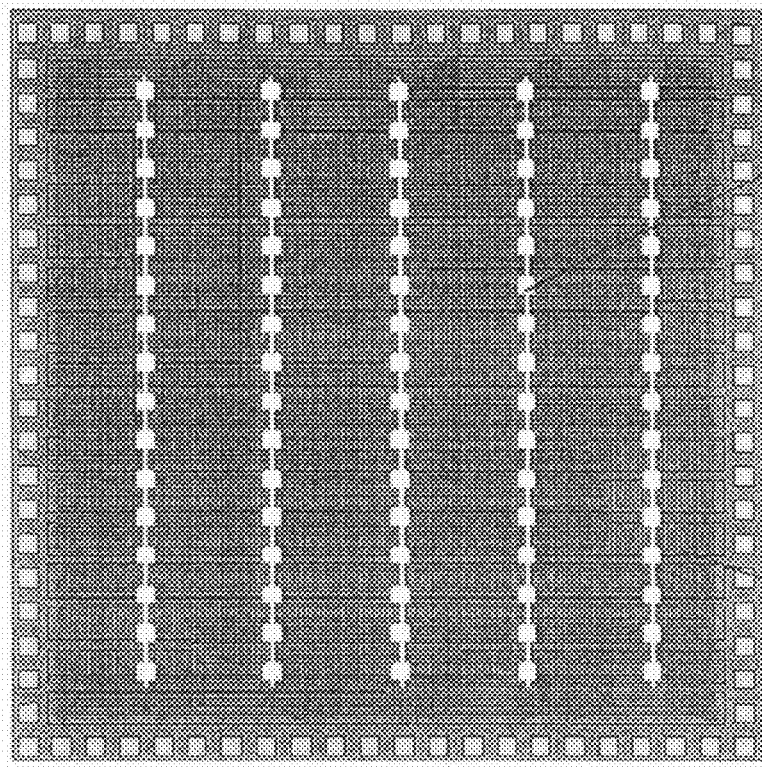
Figure 14:
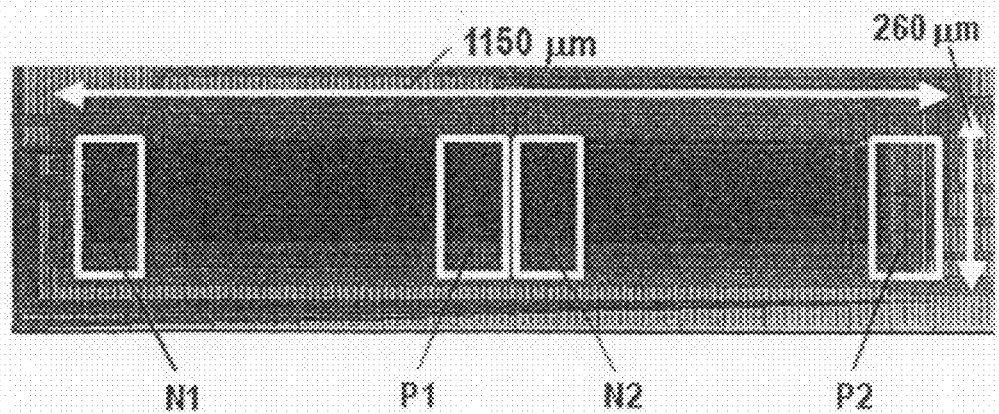
Figure 15:
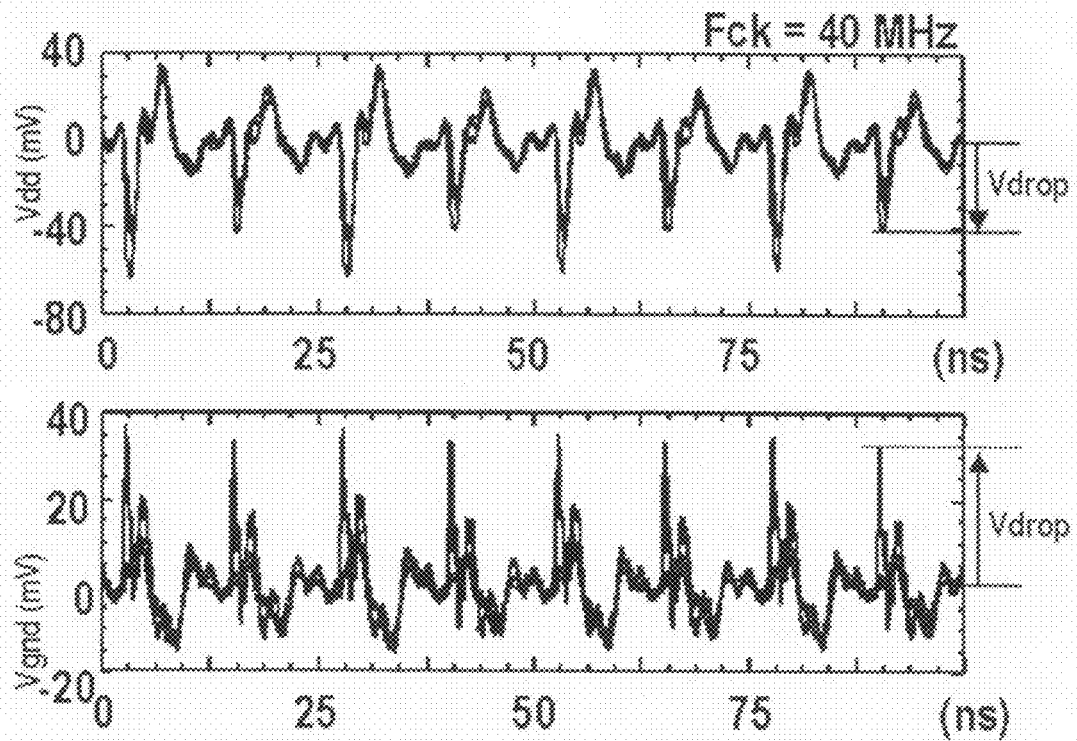
Figure 16:
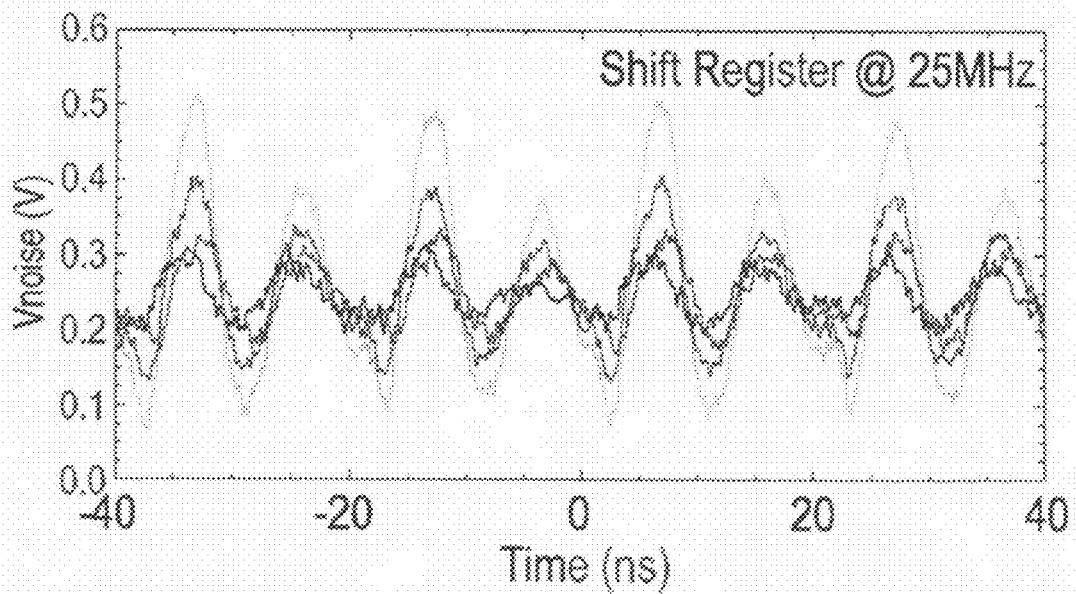
Figure 17:
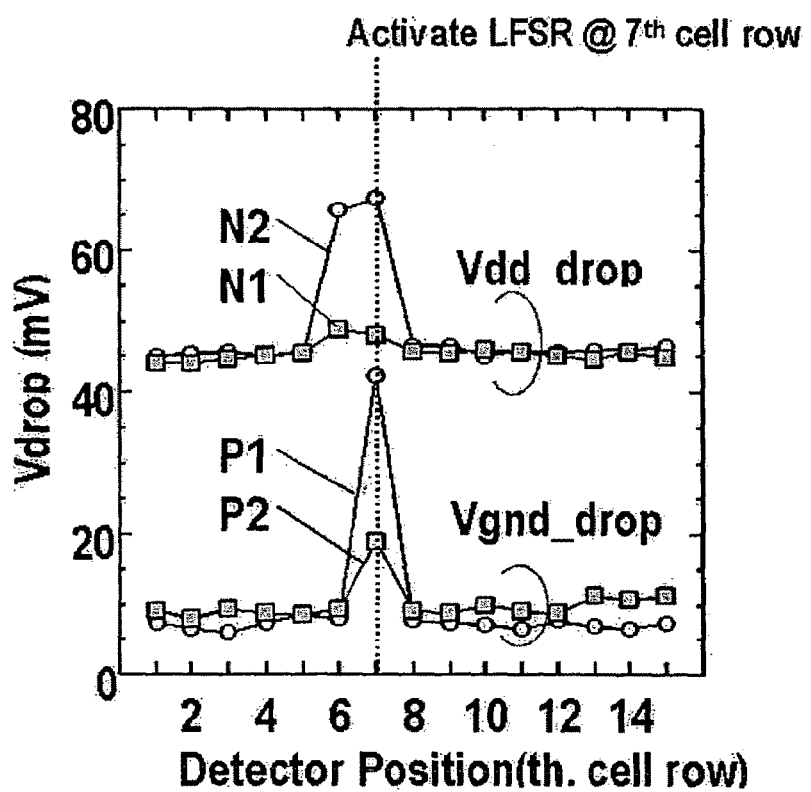
FIG. 17 a chart of the spatial distribution of the power supply noise and the ground level noise in the semiconductor integrated circuit chip.

DENOTATION OF THE REFERENCE NUMBER 1a n-type source follower
1b p-type source follower
2 Voltage-current signal conversion amplifier circuit
3 Current readout circuit
4 Select signal inverter circuit
5 Cut-off switch for switching current readout circuit
6 Sampling switch circuit
7a n-type noise measuring front-end part
7b p-type noise measuring front-end part
8a n-type noise measuring front-end part (with the sampling switch)
8b p-type noise measuring front-end part (with the sampling switch)
10 Select signal generating digital circuit part
11 Noise measuring frond end part
12 Ground line where noise to be measured (VSS)
13 Power supply line where noise to be measured (VDD)
14 Digital main integrated circuit
20 Noise measuring circuit
21 Circuit where noise to be measured
AVDD Power supply for the noise measuring circuit
AGND Ground for the noise measuring circuit
VBS Bias voltage
VIN Input voltage to be measured
SEL Select switch
IREAD Read-out current
SW Sampling switch
IOUT signal conversion amplifier circuit output current
VDD Power supply of the main integrated circuit
VSS Ground of the main integrated circuit
Ddrop Power supply shift value
P1 Noise measuring circuit arrangement 1 of the P-well fixed ground line
P2 Noise measuring circuit arrangement 2 of the P-well fixed ground line
N1 Noise measuring circuit arrangement 1 of the N-well fixed ground line
N2 Noise measuring circuit arrangement 2 of the N-well fixed ground line
LFSR 32-bit linear feed-back shift register

What is claimed is:

1. A semiconductor integrated circuit comprising plural circuit blocks, which perform digital signal processing,
   wherein noise measuring circuits are embedded into distributed arrangement positions in said semiconductor integrated circuit,
   wherein a power supply noise waveform, a ground level noise waveform, and a spatial distribution of noise occurring positions are outputted by said noise measuring circuits, and
   wherein each of said noise measuring circuits comprises:
       a source follower connecting a power supply line of said integrated circuit to an input node of said noise measuring circuit;
       a signal conversion amplifier circuit converting voltage-input to current-output which input is an output of said source follower; and
       a current readout circuit for reading out an output current of said signal conversion amplifier circuit.

2. The semiconductor integrated circuit according to claim 1,
   wherein each of said noise measuring circuits includes a select circuit which to activate each noise measuring circuit selectively.

3. The semiconductor integrated circuit according to claim 1,
   wherein each of said noise measuring circuits further comprises a sampling switch circuit to an output node of said source follower.

4. The semiconductor integrated circuit according to claim 1,
   wherein said current readout circuit of each noise measuring circuit is commonly shared.

5. A diagnosis analysis method for a semiconductor integrated circuit, comprising:
   performing a malfunction diagnosis, an error analysis, a malfunction prediction, and an error prediction of said semiconductor integrated circuit based on an actual noise data obtained from said integrated circuit wherein said noise measuring circuits according to claim 1 are embedded in said integrated circuit.

6. A manufacturing process of a semiconductor integrated circuit including a sequential process for a designing process, a manufacturing process, and a testing (evaluating) process for said semiconductor integrated circuit wherein:
   said manufacturing process comprises a step for embedding noise measuring circuits according to claim 1 into distributed arrangement positions in said semiconductor integrated circuit; and
   said testing process comprises a step for measuring and evaluating said power supply noise waveform, ground level noise waveform, and a spatial distribution data by said noise measuring circuit.

7. The manufacturing process according to claim 6, wherein said noise measuring circuits are automatically embedded into said positions of said integrated circuit by applying a standard cell base automatic wire layout designing method.

8. The manufacturing process according to claim 6, wherein a built-in self test is performed by correlating a select logic of said noise measuring circuit to a test mode (a test pattern) logic of said integrated circuit.

9. A semiconductor integrated circuit comprising plural circuit blocks, which perform digital signal processing,
   wherein noise measuring circuits are embedded into distributed arrangement positions in said semiconductor integrated circuit,
   wherein a power supply noise waveform, a ground level noise waveform, and a spatial distribution of noise occurring positions are outputted by said noise measuring circuits, and
   wherein each of said noise measuring circuits comprises:
       a p-type source follower connecting a ground line of said integrated circuit to an input node of said noise measuring circuit;
       a signal conversion amplifier circuit converting voltage-input to current-output which input is an output of said source follower; and
       a current readout circuit for reading out an output current of said signal conversion amplifier circuit.

10. The semiconductor integrated circuit according to claim 9,
wherein each of said noise measuring circuits includes a select circuit which functions to activate each of said measuring circuit selectively.

11. The semiconductor integrated circuit according to claim 9,
wherein each of said noise measuring circuits further comprises a sampling switch circuit to an output node of said source follower.

12. The semiconductor integrated circuit according to claim 9,
wherein said current readout circuit of each of the noise measuring circuits is commonly shared.

13. An evaluation method and an adjustment method of a design CAD tool for the semiconductor integrated circuit according to claim 1, wherein an analysis model evaluation or a parameter adjustment is performed based on actually measured noise data measured from said distributed arrangement positions of said noise measuring circuits.

14. The evaluation method and an adjustment method of a design CAD tool for the semiconductor integrated circuit according to claim 13, wherein the analysis model evaluation is a power supply current analysis model for said design CAD tool for said semiconductor integrated circuit.

15. The evaluation method and an adjustment method of a design CAD tool for the semiconductor integrated circuit according to claim 13, wherein the parameter adjustment is an impedance coefficient.

16. A diagnosis analysis method for a semiconductor integrated circuit, comprising:
performing a malfunction diagnosis, an error analysis, a malfunction prediction, and an error prediction of said semiconductor integrated circuit based on an actual noise data obtained from said integrated circuit wherein said noise measuring circuits according to claim 9 are embedded in said integrated circuit.

17. An evaluation method and an adjustment method of a design CAD tool for the semiconductor integrated circuit, wherein an analysis model evaluation or a parameter adjustment is performed based on actually measured noise data measured from said distributed arrangement positions of said noise measuring circuits according to claim 9.

18. A manufacturing process of a semiconductor integrated circuit including a sequential process for a designing process, a manufacturing process, and a testing (evaluating) process for said semiconductor integrated circuit wherein:
said manufacturing process comprises a step for embedding noise measuring circuits according to claim 9 into distributed arrangement positions in said semiconductor integrated circuit; and
said testing process comprises a step for measuring and evaluating said power supply noise waveform, ground level noise waveform, and a spatial distribution data by said noise measuring circuit.

19. The manufacturing process according to claim 18, wherein said noise measuring circuits are automatically embedded into said positions of said integrated circuit by applying a standard cell base automatic wire layout designing method.

20. The manufacturing process according to claim 18, wherein a built-in self test is performed by correlating a select logic of said noise measuring circuit to a test mode (a test pattern) logic of said integrated circuit.

* * * * *